United States Patent [19]

Bharat et al.

[11] Patent Number: 4,757,210
[45] Date of Patent: Jul. 12, 1988

[54] EDGE ILLUMINATED DETECTOR ARRAYS FOR DETERMINATION OF SPECTRAL CONTENT

[75] Inventors: Ramasesha Bharat, Orange; Michael D. Petroff, Fullerton, both of Calif.

[73] Assignee: Rockwell International Corporation, El Segundo, Calif.

[21] Appl. No.: 20,418

[22] Filed: Mar. 2, 1987

[51] Int. Cl.[4] .............................................. H01L 27/14
[52] U.S. Cl. ...................................... 250/578; 357/30
[58] Field of Search ................. 250/578, 211 J, 211 R, 250/226; 356/319, 320, 326; 357/30 H, 30 L, 30 R

[56] References Cited

U.S. PATENT DOCUMENTS

| | | | |
|---|---|---|---|
| 3,987,298 | 10/1976 | Rotolante | 250/211 J |
| 4,568,960 | 2/1986 | Petroff et al. | 357/30 |
| 4,581,625 | 4/1986 | Gay et al. | 357/30 L |
| 4,586,068 | 4/1986 | Petroff et al. | 357/30 |

Primary Examiner—Edward P. Westin
Attorney, Agent, or Firm—H. Fredrick Hamann; Craig O. Malin; John J. Deinken

[57] ABSTRACT

An edge illuminated optical detector array includes a series of two or more detectors which operate under an applied electric field. Each detector includes an extrinsic semiconducting active layer with a first conductivity type impurity concentration high enough to create an impurity energy band, and an intrinsic semiconducting blocking layer in which substantially no charge transport occurs by an impurity conduction mechanism. The detectors are positioned relative to one another such that optical energy incident on the array and directed substantially orthogonal to the applied electric field impinges on the first detector in the series and the portion of the optical energy which is transmitted by each detector is directed to the succeeding detector in the series. In this manner, the spectral content of the optical energy impinging on each detector is modified by the spectral transmission characteristics of the preceding detectors. In a solid state photomultiplier detector embodiment, each detector also includes an extrinsic semiconducting buffered layer having a first conductivity type impurity concentration which is high enough to create an impurity energy band and a second conductivity type impurity concentration which is high enough that first conductivity type carriers injected into the buffered layer recombine with ionized first conductivity type impurities. Each active layer also includes a second conductivity type impurity concentration which is low enough that first conductivity type carriers photogenerated in the active layer can drift through the active layer without recombining with ionized first conductivity type impurities.

30 Claims, 2 Drawing Sheets

EDGE ILLUMINATED DETECTOR ARRAYS FOR DETERMINATION OF SPECTRAL CONTENT

BACKGROUND OF THE INVENTION

This invention is concerned with the detection of electromagnetic radiation.

The detection of electromagnetic energy is made possible because of a series of complex interactions which occur between such energy and certain kinds of materials. These interactions enable remove sensing systems to record contrasts between an observed object and its background. Recent improved detector designs based on the phenomenon of impurity band conduction (See Petroff, et al., U.S. Pat. No. 4,568,960 and Petroff, et al., U.S. Pat. No. 4,586,068) have significantly enhanced the power of the optical detectors available in the art. The output of these detectors in response to incident photons, however, depends on the total number of photons absorbed and does not provide information regarding the wavelengths of the photons which are absorbed.

It would be desirable in some applications to be able to discriminate between optical sources having different spectral contents. A need has thus developed in the art for an impurity band conduction detector which can provide spectral discrimination.

SUMMARY OF THE INVENTION

The edge illuminated optical detector array of this invention includes a series of two or more detectors which operate under an applied electric field. In a blocked impurity band detector embodiment, each detector includes an extrinsic semiconducting active layer with a first conductivity type impurity concentration high enough to create an impurity energy band, and an intrinsic semiconducting blocking layer with first and second conductivity type impurity concentrations which are low enough that substantially no charge transport occurs by an impurity conduction mechanism. The active and blocking layers are positioned between first and second electrical contacts such that an electrical potential applied to the contacts creates an electric field across the layers. The detectors are positioned relative to one another such that optical energy incident on the array and directed substantially orthogonal to the applied electric field impinges on the first detector in the series and the portion of the optical energy which is transmitted by each detector is directed to the succeeding detector in the series. In this manner, the spectral content of the optical energy impinging on each detector is modified by the spectral transmission characteristics of the preceding detectors.

Another embodiment utilizes solid state photomultiplier detectors. In this configuration, each detector also includes an extrinsic semiconducting buffered layer positioned such that the active layer is between the blocking layer and the buffered layer, the buffered layer having a first conductivity type impurity concentration which is high enough to create an impurity energy band and a second conductivity type impurity concentration which is high enough that first conductivity type carriers injected into the buffered layer recombine with ionized first conductivity type impurities. In this embodiment, each active layer also includes a second conductivity type impurity concentration which is low enough that first conductivity type carriers photogenerated in the active layer can drift through the active layer without recombining with ionized first conductivity type impurities.

The invention also includes an optical focal plane with a plurality of substrates, each substrate including a plurality of edge illuminated optical detector arrays. The detectors within each array are positioned relative to one another such that optical energy incident on the array and directed substantially orthogonal to the applied electric field impinges on the first detector in the series and such that the portion of the optical energy which is transmitted by each detector is directed to the succeeding detector in the series, so that the spectral content of the optical energy impinging on each detector is modified by the spectral transmission characteristics of the preceding detectors in the array. The substrates and the arrays are positioned such that the first detectors in each series define a two dimensional focal plane.

DESCRIPTION OF THE DRAWINGS

Additional details of the invention are described below in conjunction with the drawings, in which the same numerals are used to refer to like elements throughout all the figures. In the drawings.

DESCRIPTION OF THE INVENTION

It is an outstanding feature of this invention to provide an edge-illuminated detector array which exploits the optical transmission properties of extrinsic semiconductor materials to modify the spectral content of the optical energy which is applied to successive detectors in the array. Since the transmission properties of a doped semiconductor and the response characteristics of the detectors can be calibrated, and since the response of each detector in the array depends on the spectral content of the input to it, the spectral content of the radiation incident on the array can be derived from the relative response of each detector in the array. The detector arrays of this invention are intended to be made of impurity band conduction type detectors, such as blocked impurity band detectors and solid state photomultiplier detectors, the structure and operation of which are discussed in U.S. Pat. Nos. 4,568,960 (blocked impurity band detectors) and 4,586,068 (solid state photomultiplier detectors). The teachings of these patents are incorporated by reference.

Figure 1:
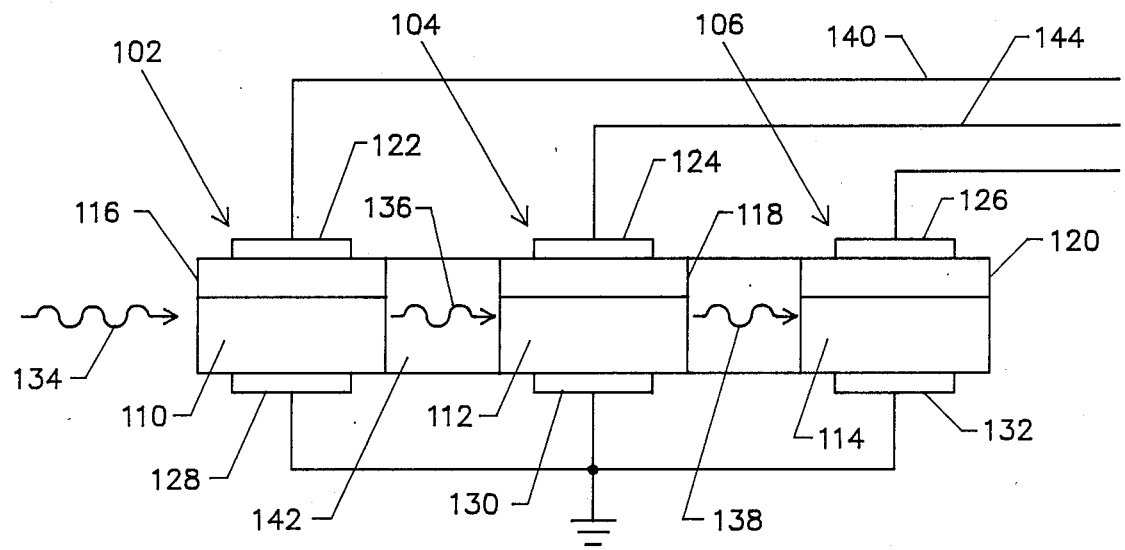
FIG. 1 is a schematic cross sectional side view of an edge illuminated blocked impurity band detector array.

FIG. 1 is a schematic cross sectional side view of an edge illuminated blocked impurity band detector array constructed according to this invention. As those skilled in the art will appreciate, some of the spatial dimensions of the drawings are exaggerated relative to other dimensions in order to better explain the operation and features of the invention. Furthermore, an actual detector array may include additional components, such as a substrate, which are not included in the drawing since they do not play a role in the detection function which is the subject of this invention. A series of three detectors 102, 104, and 106 is included in this embodiment, although those skilled in the art will appreciate that the series can include as few as two detectors or more than three detectors. Each detector includes an extrinsic semiconducting active layer (layers 110, 112, and 114) which has a first conductivity type impurity concentration high enough to create an impurity energy band. An intrinsic semiconducting blocking layer (layers 116, 118, and 120) in each detector is provided with first and second conductivity type impurity concentrations which are low enough that substantially no charge transport occurs by an impurity conduction mechanism. A first electrical contact (contacts 122, 124, and 126) is placed on the top of each detector, with a second electrical contact (contacts 128, 130, and 132) on the bottom of each detector. The active and blocking layers of each detector are positioned between the contacts such that an electrical potential applied to the contacts creates an electrical bias across the layers. The detectors are aligned in a row along the optic axis of incoming optical energy 134, this direction being orthogonal to the direction of the applied bias. The incoming signal impinges on the first detector 102 in the series. A portion of the incoming energy is absorbed in and detected by the first detector, while the remainder 136 is transmitted by the first detector and impinges on the second detector 104. Similarly, the portion 138 of the optical energy which is transmitted by the second detector impinges on the third detector 106. In this manner, the portion of the optical energy transmitted by each detector is directed to the succeeding detector in the series, so that the spectral content of the optical energy which impinges on each detector is modified by the spectral transmission characteristics of the preceding detectors.

Consider the detection mechanism for the first two detectors 102 and 104 in FIG. 1 when the active layers of those detectors are fabricated of silicon doped with arsenic and the incident energy comprises infrared photons at two wavelengths $\lambda_L$ and $\lambda_S$ in the range from approximately 2 to 20 um, with $\lambda_L > \lambda_S$. A portion of the infrared photons will be absorbed in the first detector 102 and that detector will produce a commensurate electrical output signal on the line 140. The amount of photon absorption in the first detector and the output signal characteristics of the first detector will depend on the structural parameters of the first detector, such as impurity concentrations and detector dimensions. In any event, however, the first detector will selectively absorb the longer wavelength photons relatively more than the shorter wavelength photons, due to the properties of arsenic doped silicon. Thus the spectral content of the photon flux 136 exiting the first detector 102 and incident on the second detector 104 will be different than that of the incident energy 134. In particular, the spectral content of the signal 136 will be relatively richer in shorter wavelength photons. Furthermore, if the material 142 which occupies the optical path between the first and second detectors is undoped silicon, this part of the path will be substantially transparent in the infrared spectral region. Part of the photons incident on the second detector 104 will be absorbed in that detector, which will generate a corresponding electrical output on the line 144. The second detector, like the first, will selectively absorb a greater fraction of the longer wavelength photons incident on it, so that the beam 138 leaving the second detector will be relatively further depleted of long wavelength photons.

This mechanism may be effectively illustrated by considering a specific example. Assume that the first two detectors are identical in structure, there are no reflections at the interfaces, the absorption of $\lambda_L$ in each detector is 40%, and the absorption of $\lambda_S$ is 20%. Two different input signals, each having an equal number of total input photons, are postulated. The first input signal consists of 150 photons, 50 at $\lambda_L$ and 100 at $\lambda_S$. When receiving the first signal, the first detector will produce an output proportional to 40 photons $(0.4 \times 50 + 0.2 \times 100)$ and the second detector will produce an output proportional to 28 photons $[0.4(50-0.4 \times 50) + 0.2(100-0.2 \times 100)]$. The ratio of the second detector's output to that of the first is thus 0.7 in response to the first input signal. The second signal input consists of 150 photons, 100 at $\lambda_L$ and 50 at $\lambda_S$. After receiving the second signal, the first detector will produce an output proportional to 50 photons $(0.4 \times 100 + 0.2 \times 50)$ and the second detector will produce an output proportional to 32 photons $[0.4(100-0.4 \times 100) + 0.2(50-0.2 \times 50)]$. The ratio of the second detector's output to that of the first in the case of the second signal is thus 0.64.

As this example shows, the relative responses of the two detectors will change with a change in the color or spectral content of the input to the detector array. The array of this invention thus provides the capability of extracting information about the color or spectral content of the incident beam. Note that for this capability to be effective, the input spectrum must be limited to the region where the relative absorption spectrum of the detector material is monotonic.

While only two identical detectors have been treated in this example to simplify the analysis, those skilled in the art will appreciate that the invention contemplates the use of detectors of various sizes configured in a larger array to enable the resolution of several wavelengths. Furthermore, the simplifying assumptions which were made to illustrate the concept are not required constraints on this technique under more realistic conditions. Non-zero reflections at interfaces, for example, can be accounted for by analysis and calibration. In addition, the non-normal incidence of photons on the edge of the array can be tolerated to some extent, since the detector structure can be configured to guide the light waves within the active regions of the detectors. The optical transmission spectrum of each detector could also be tailored by selecting the dopant and host crystal materials used in fabrication.

Figure 2:
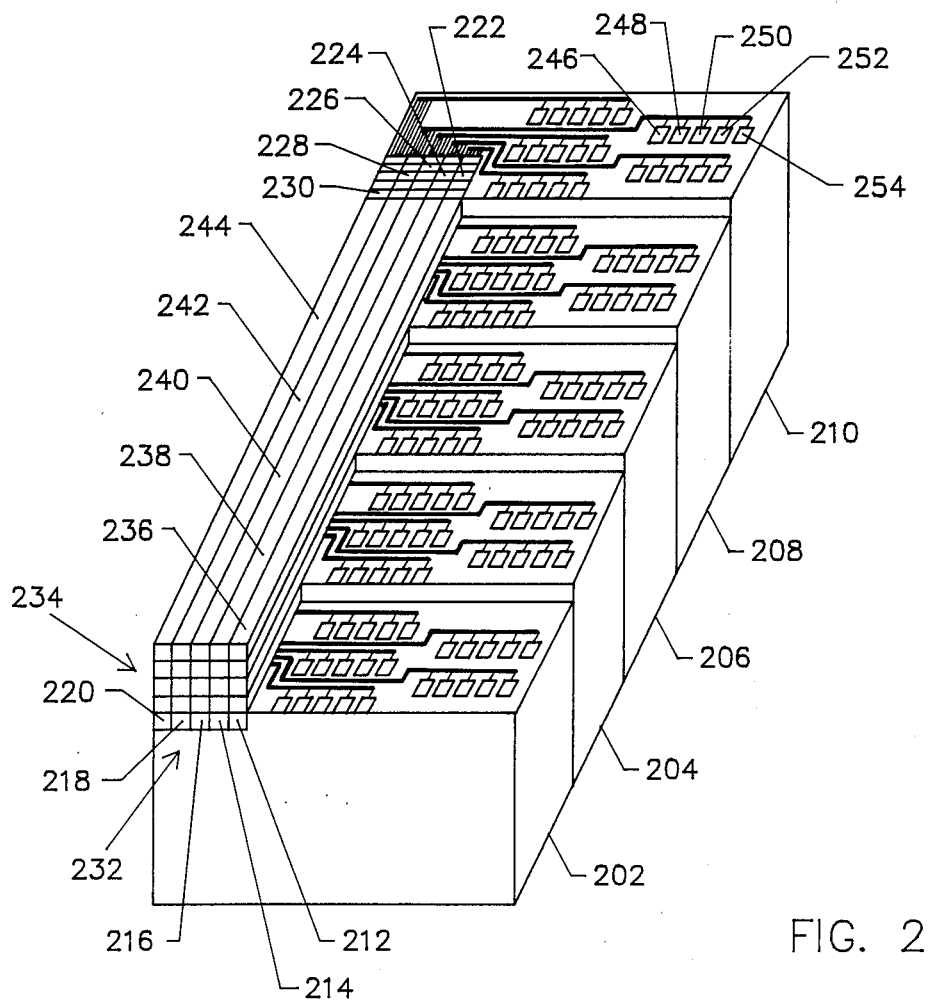
FIG. 2 is a perspective view of a detector focal plane which extends the detector array concept of the invention to two dimensional imaging.

FIG. 2 is a perspective view of a detector focal plane, illustrating how the detector array concept of this invention can be extended to imaging a scene in two dimensions. The focal plane in this embodiment includes five dice 202, 204, 206, 208, and 210, although those skilled in the art will appreciate that the number of dice can vary depending on the desired application. Each die contains a row of five detector arrays, each similar to the array illustrated in FIG. 1. Thus, for example, the die 202 includes arrays 212, 214, 216, 218, and 220, and the die 210 includes arrays 222, 224, 226, 228, and 230. Each die is affixed to the preceding die with an offset relationship, so that the detector arrays on each die are receptive to edge illumination by optical energy incident along an optical axis 232. A focal plane 234 is created by aligning each array on all but the first die with a light pipe to convey optical energy from the focal plane to each detector array on the die. The light pipes 236, 238, 240, 242, and 244, for example, convey optical energy to the detector arrays 222-230 on the die 210. The light pipes should preferably be fabricated of a transparent material with a coefficient of expansion similar to that of the detectors to avoid the problems which could otherwise arise when the focal plane array is cooled for operation at cryogenic temperatures. Several bonding pads, such as the pads 246, 248, 250, 252, and 254, are provided to couple each detector in each array with the required output circuitry. Multiplexers can be mated to each chip and to the stack of chips as well. Since the design of such output and signal processing circuitry is well known to those skilled in the art, there is no need to describe it here in any further detail.

Figure 3:
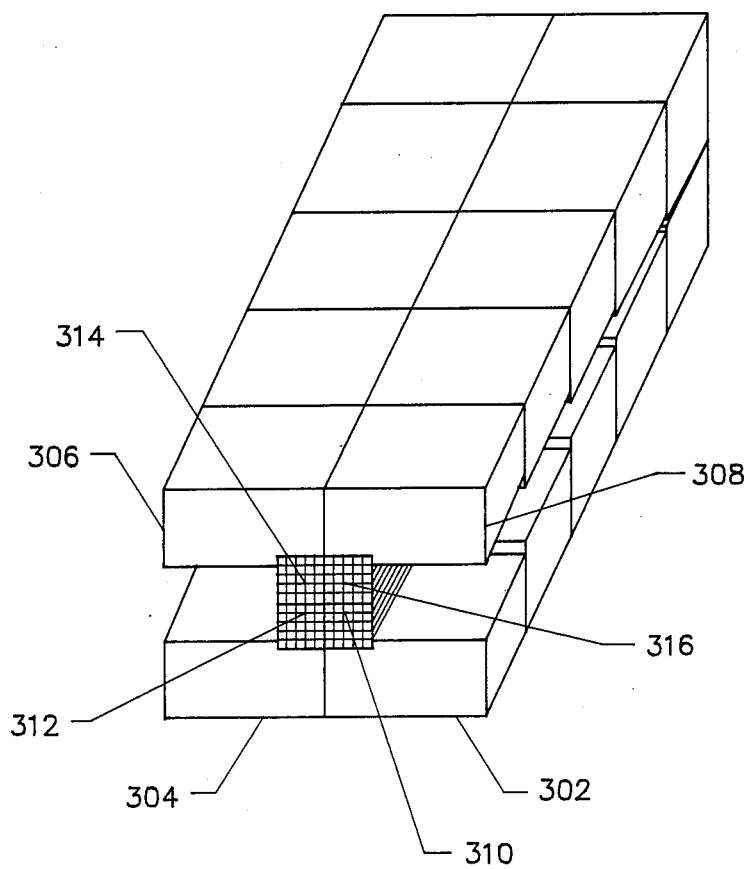
FIG. 3 is a perspective view of a detector focal plane fabricated by combining four detector arrays similar to the array of FIG. 2.

Modules of the design shown in FIG. 2 can be further combined in groups of four, as shown in FIG. 3, to produce an even larger focal plane. In FIG. 3, four modules 302, 304, 306, and 308, each similar to the module illustrated in FIG. 2, are combined to form a 10 element by 10 element focal plane made up of the four five by five element arrays 310, 312, 314, and 316 which are provided by the corresponding modules.

Figure 4:
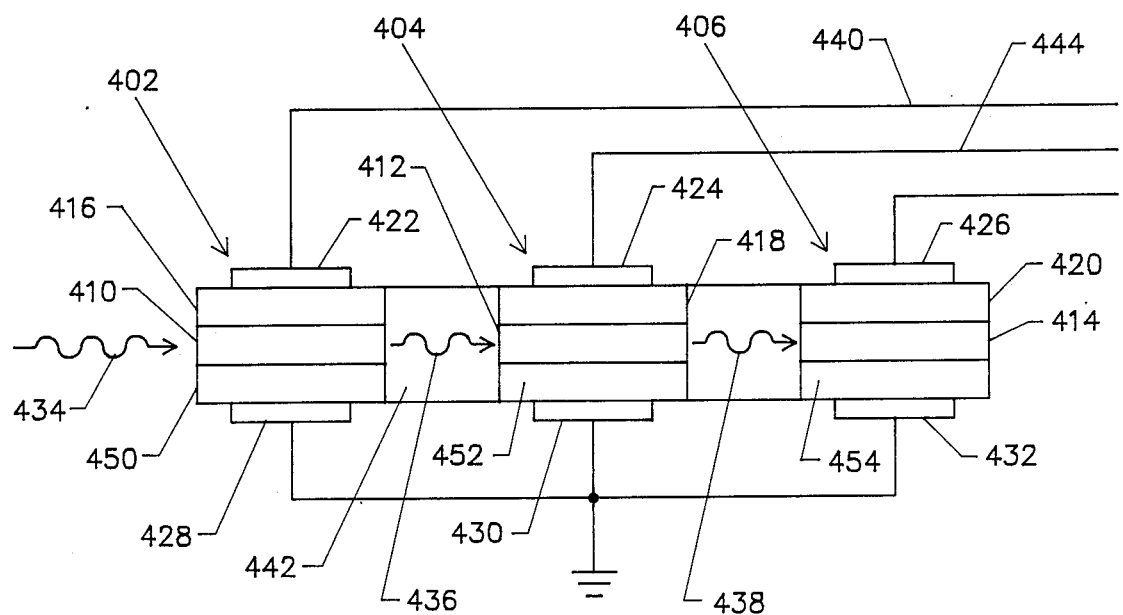
FIG. 4 is a schematic cross sectional side view of an edge illuminated detector array similar to FIG. 1, but using solid state photomultiplier detectors.

FIG. 4 is a cross-sectional side view of another edge illuminated detector array, which is similar to the array of FIG. 1, except that in FIG. 4 the array consists of solid state photomultiplier detectors. The first electrical contacts 422, 424, and 426, the second electrical contacts 428, 430, and 432, the optic axis of incoming optical energy 434, the portion 436 of optical energy transmitted by the first detector, the portion 438 of optical energy transmitted by the second detector, the line 440, the material 442, and the line 444 are all similar to the analogous elements described in connection with FIG. 1. In FIG. 4, however, the series of three detectors 402, 404, and 406 each includes an extrinsic semiconducting active layer (layers 410, 412, and 414) with a first conductivity type impurity concentration which is high enough to create an impurity energy band. The second conductivity type impurity concentration in each active layer is low enough that first conductivity type carriers photogenerated in the active layer can drift through the active layer without recombining with ionized first conductivity type impurities. An intrinsic semiconducting blocking layer (layers 416, 418, and 420) in each detector is doped with first and second conductivity type impurity concentrations which are low enough that substantially no charge transport occurs by an impurity conduction mechanism. An extrinsic semiconducting buffered layer in each detector (layers 450, 452, and 454) has a first conductivity type impurity concentration which is high enough to create an impurity energy band and a second conductivity type impurity concentration which is high enough that first conductivity type carriers injected into the buffered layer will recombine with ionized first conductivity type impurities.

The preferred embodiments of this invention have been illustrated and described above. Modifications and additional embodiments, however, will undoubtedly be apparent to those skilled in the art. The inventive concept, for example, is not limited either to the particular materials discussed herein nor to detection in the infrared region of the spectrum. Furthermore, equivalent elements may be substituted for those illustrated and described herein, parts or connections might be reversed or otherwise interchanged, and certain features of the invention may be utilized independently of other features. A number of alternative embodiments, for example, are described in the aforementioned patents and could be used for the detector arrays of this invention. Consequently, the exemplary embodiments should be considered illustrative, rather than inclusive, while the appended claims are more indicative of the full scope of the invention.

We claim:

1. An edge illuminated optical detector array, comprising a series of two or more detectors for operation under an applied electric field, each detector including:
    an extrinsic semiconducting active layer with a first conductivity type impurity concentration which is high enough to create an impurity energy band;
    an intrinsic semiconducting blocking layer with first and second conductivity type impurity concentrations which are low enough that substantially no charge transport occurs by an impurity conduction mechanism; and
    first and second electrical contacts,
    the active and blocking layers being positioned between the contacts such that an electrical potential applied to the contacts creates an electric field across the layers,
    the detectors being positioned relative to one another such that optical energy incident on the array and directed substantially orthogonal to the applied electric field impinges on the first detector in the series and such that the portion of the optical energy which is transmitted by each detector is directed to the succeeding detector in the series, so that the spectral content of the optical energy impinging on each detector is modified by the spectral transmission characteristics of the preceding detectors.

2. The array of claim 1, wherein the first conductivity type impurities further comprise donor impurities and the second conductivity type impurities further comprise acceptor impurities.

3. The array of claim 1, wherein the first conductivity type impurities further comprise acceptor impurities and the second conductivity type impurities further comprise donor impurities.

4. The array of claim 1, wherein the blocking layer further comprises an undoped semiconductor layer.

5. The array of claim 1, wherein the blocking layer is epitaxially deposited on the active layer.

6. The array of claim 5, wherein the first contact further comprises a degenerately doped region in the blocking layer.

7. The array of claim 5, wherein the first contact further comprises an ion implanted region in the blocking layer.

8. The array of claim 1, wherein each detector further comprises an extrinsic semiconducting buffered layer positioned such that the active layer is between the blocking layer and the buffered layer, the buffered layer having a first conductivity type impurity concentration which is high enough to create an impurity energy band and a second conductivity type impurity concentration which is high enough that first conductivity type carriers injected into the buffered layer recombine with ionized first conductivity type impurities, each active layer further comprising a second conductivity type impurity concentration which is low enough that first conductivity type carriers photogenerated in the active layer can drift through the active layer without recombining with ionized first conductivity type impurities.

9. An edge illuminated optical detector array, comprising a series of two or more detectors for operation under an applied electric field, each detector including:
an extrinsic semiconducting buffered layer with a first conductivity type impurity concentration which is high enough to create an impurity energy band and with a second conductivity type impurity concentration which is high enough that first conductivity type carriers injected into the buffered layer recombine with ionized first conductivity type impurities;
an intrinsic semiconducting blocking layer with first and second conductivity type impurity concentrations which are low enough that substantially no charge transport occurs by an impurity conduction mechanism;
an extrinsic semiconducting active layer between the blocking layer and the buffered layer with a first conductivity type impurity concentration which is high enough to create an impurity energy band and with a second conductivity type impurity concentration which is low enough that first conductivity type carriers photogenerated in the active layer can drift through the active layer without recombining with ionized first conductivity type impurities;
a first electrical contact in contact with the blocking layer for collecting first conductivity type carriers without injecting second conductivity type carriers; and
a second electrical contact in contact with the buffered layer for collecting carriers from the impurity band,
the buffered, active, and blocking layers being positioned between the contacts such that an electrical potential applied to the contacts creates an electric field across the layers,
the detectors being positioned relative to one another such that optical energy incident on the array and directed substantially orthogonal to the applied electric field impinges on the first detector in the series and such that the portion of the optical energy which is transmitted by each detector is directed to the succeeding detector in the series, so that the spectral content of the optical energy impinging on each detector is modified by the spectral transmission characteristics of the preceding detectors.

10. The array of claim 9, wherein the first conductivity type impurities further comprise donor impurities and the second conductivity type impurities further comprise acceptor impurities.

11. The array of claim 9, wherein the first conductivity type impurities further comprise acceptor impurities and the second conductivity type impurities further comprise donor impurities.

12. The array of claim 9, wherein the blocking layer further comprises an undoped semiconductor layer.

13. The array of claim 9, wherein the active layer is epitaxially deposited on the buffered layer and the blocking layer is epitaxially deposited on the active layer.

14. The array of claim 13, wherein the second contact further comprises a degenerately doped region in the buffered layer.

15. The array of claim 13, wherein the second contact further comprises an ion implanted region in the buffered layer.

16. An optical focal plane, comprising:
a plurality of substrates, each substrate including a plurality of edge illuminated optical detector arrays, each array including a series of two or more detectors for operation under an applied electrical field, each detector including:
an extrinsic semiconducting active layer with a first conductivity type impurity concentration which is high enough to create an impurity energy band;
an intrinsic semiconducting blocking layer with first and second conductivity type impurity concentrations which are low enough that substantially no charge transport occurs by an impurity conduction mechanism; and
first and second electrical contacts,
the active and blocking layers being positioned between the contacts such that an electrical potential applied to the contacts creates an electric field across the layers,
the detectors within each array being positioned relative to one another such that optical energy incident on the array and directed substantially orthogonal to the applied electric field impinges on the first detector in the series and such that the portion of the optical energy which is transmitted by each detector is directed to the succeeding detector in the series, so that the spectral content of the optical energy impinging on each detector is modified by the spectral transmission characteristics of the preceding detectors in the array,
the substrates and the arrays being positioned such that the first detectors in each series define a two dimensional focal plane.

17. The array of claim 16, wherein the first conductivity type impurities further comprise donor impurities and the second conductivity type impurities further comprise acceptor impurities.

18. The array of claim 16, wherein the first conductivity type impurities further comprise acceptor impurities and the second conductivity type impurities further comprise donor impurities.

19. The array of claim 16, wherein the blocking layer further comprises an undoped semiconducting layer.

20. The array of claim 16, wherein the blocking layer is epitaxially deposited on the active layer.

21. The array of claim 20, wherein the first contact further comprises a degenerately doped region in the blocking layer.

22. The array of claim 20, wherein the first contact further comprises an ion implanted region in the blocking layer.

23. The array of claim 16, wherein each detector further comprises an extrinsic semiconducting buffered layer positioned such that the active layer is between the blocking layer and the buffered layer, the buffered layer having a first conductivity type impurity concentration which is high enough to create an impurity energy band and a second conductivity type impurity concentration which is high enough that first conductivity type carriers injected into the buffered layer recombine with ionized first conductivity type impurities, each active layer further comprising a second conductivity type impurity concentration which is low enough that first conductivity type carriers photogenerated in the active layer can drift through the active layer without recombining with ionized first conductivity type impurities.

24. An optical focal plane, comprising:

a plurality of substrates, each substrate including a plurality of edge illuminated optical detector arrays, each array including a series of two or more detectors for operation under an applied electric field, each detector including:

an extrinsic semiconducting buffered layer with a first conductivity type impurity concentration which is high enough to create an impurity energy band and with a second conductivity type impurity concentration which is high enough that first conductivity type carriers injected into the buffered layer recombine with ionized first conductivity type impurities;

an intrinsic semiconducting blocking layer with first and second conductivity type impurity concentrations which are low enough that substantially no charge transport occurs by an impurity conduction mechanism;

an extrinsic semiconducting active layer between the blocking layer and the buffered layer with a first conductivity type impurity concentration which is high enough to create an impurity energy band and with a second conductivity type impurity concentration which is low enough that first conductivity type carriers photogenerated in the active layer can drift through the active layer without recombining with ionized first conductivity type impurities;

a first electrical contact in contact with the blocking layer for collecting first conductivity type carriers without injecting second conductivity type carriers; and a second electrical contact in contact with the buffered layer for collecting carriers from the impurity band, the buffered, active, and blocking layers being positioned between the contacts such that an electrical potential applied to the contacts creates an electric field across the layers, the detectors within each array being positioned relative to one another such that optical energy incident on the array and directed substantially orthogonal to the applied electric field impinges on the first detector in the series and such that the portion of the optical energy which is transmitted by each detector is directed to the succeeding detector in the series, so that the spectral content of the optical energy impinging on each detector is modified by the spectral transmission characteristics of the preceding detectors in the array, the substrates and the arrays being positioned such that the first detectors in each series define a two dimensional focal plane.

25. The array of claim 24, wherein the first conductivity type impurities further comprise donor impurities and the second conductivity type impurities further comprise acceptor impurities.

26. The array of claim 24, wherein the first conductivity type impurities further comprise acceptor impurities and the second conductivity type impurities further comprise donor impurities.

27. The array of claim 24, wherein the blocking layer further comprises an undoped semiconducting layer.

28. The array of claim 24, wherein the active layer is epitaxially deposited on the buffered layer and the blocking layer is epitaxially deposited on the active layer.

29. The array of claim 28, wherein the second contact further comprises a degenerately doped region in the buffered layer.

30. The array of claim 28, wherein the second contact further comprises an ion implanted region in the buffered layer.

* * * * *